(12) United States Patent
Noys

(10) Patent No.: US 11,193,995 B2
(45) Date of Patent: Dec. 7, 2021

(54) ELECTROMAGNET AND ASSEMBLY

(71) Applicant: Siemens Healthcare Limited, Camberley (GB)

(72) Inventor: Jonathan Noys, Oxfordshire (GB)

(73) Assignee: Siemens Healthcare Limited, Camberley (GB)

( * ) Notice: Subject to any disclaimer, the term of this patent is extended or adjusted under 35 U.S.C. 154(b) by 0 days.

(21) Appl. No.: 16/753,927

(22) PCT Filed: Sep. 25, 2018

(86) PCT No.: PCT/EP2018/075940
§ 371 (c)(1),
(2) Date: Apr. 6, 2020

(87) PCT Pub. No.: WO2019/072545
PCT Pub. Date: Apr. 18, 2019

(65) Prior Publication Data
US 2020/0355767 A1    Nov. 12, 2020

(30) Foreign Application Priority Data
Oct. 6, 2017 (GB) ..................... 1716342

(51) Int. Cl.
*G01R 33/38* (2006.01)
*G01R 33/3815* (2006.01)
*H01F 6/06* (2006.01)

(52) U.S. Cl.
CPC ..... *G01R 33/3802* (2013.01); *G01R 33/3815* (2013.01); *H01F 6/06* (2013.01)

(58) Field of Classification Search
CPC .... G01R 33/3802; G01R 33/3815; H01F 6/06
See application file for complete search history.

(56) References Cited

U.S. PATENT DOCUMENTS

| | | |
|---|---|---|
| 2011/0291782 A1 | 12/2011 | Calvert |
| 2012/0068804 A1* | 3/2012 | Dunckley ............. H01F 7/20 336/205 |
| 2012/0214674 A1 | 8/2012 | Blakes et al. |
| 2016/0314885 A1* | 10/2016 | Davis ............... G01R 33/3802 |
| 2017/0229239 A1* | 8/2017 | Davis ............... G01R 33/3815 |

FOREIGN PATENT DOCUMENTS

| | | |
|---|---|---|
| GB | 2484066 A | 4/2012 |
| JP | S6199046 U | 6/1986 |

* cited by examiner

*Primary Examiner* — G. M. A Hyder
(74) *Attorney, Agent, or Firm* — Schiff Hardin LLP

(57) ABSTRACT

An electromagnet of an electromagnet assembly for a Magnetic Resonance Imaging (MRI) apparatus. The electromagnet includes an annular coil that is configured to generate a magnetic field and has a first axially outer surface; a support element that is bonded to the first axially outer surface of the annular coil and is configured to mount the annular coil in the MRI apparatus; and a support structure comprising a pair of axially-directed support plates spaced apart from one another along a radial direction of the annular coil by a distance which is greater than a radial thickness of the annular coil forming a cavity therebetween, wherein the support element is received in the cavity and mechanically fastened to the support plates.

11 Claims, 5 Drawing Sheets

ELECTROMAGNET AND ASSEMBLY

The present disclosure relates to an arrangement for mounting an electromagnet suitable for applications in Magnetic Resonance Imaging.

In particular the disclosure relates to an electromagnet and an electromagnet assembly for a Magnetic Resonance Imaging apparatus.

BACKGROUND

In Magnetic Resonance Imaging a plurality of electromagnets comprising superconducting coils is energised to generate a magnetic field which is both strong and spatially confined. This causes interaction between the electromagnets, thus subjecting them to electromagnetic loads. Moreover, transportation and installation may also subject the electromagnets to loads. In order to maintain the desired performance of the electromagnets, such loads need to be managed by the means used for supporting the coil.

A known means for supporting electromagnets involves a mechanically-supported journal into which the coil is wound. This arrangement, however, may not sufficiently restrain relative movement of the journal and the electromagnets.

Another known means for supporting electromagnets involves a tensile support wrapped around the electromagnets. This arrangement may not provide sufficient rotational restraint to effectively manage transportation loads. Additionally such an arrangement may be difficult to configure to adequately achieve small tolerances required for spatially locating the electromagnets. Any deviation from an optimal relative position of the electromagnets may result in local stress concentration detrimental to performance.

Hence an arrangement which allows for accurate and secure mounting of an electromagnet of a MRI device is highly desirable.

US2016/314885 and JPS6199046U describe arrangements for supporting superconducting coils.

SUMMARY

According to the present disclosure there is provided an apparatus and method as set forth in the appended claims. Other features of the invention will be apparent from the dependent claims, and the description which follows.

Accordingly there may be provided an electromagnet 100 for a Magnetic Resonance Imaging MRI apparatus. The electromagnet 100 may comprise a coil 110 for generating a magnetic field, the coil 110 having a first axially outer surface 112, and a support element 120 for mounting the coil 110 in the MRI. The support element 120 may be bonded to the first axially outer surface 112 of the coil 110.

Thus the bonded support element provides a means for securing the coil to a support structure and, thereby, inhibit axial and rotational movement of the electromagnet.

The support element 120 may be configured for being mechanically fastened to a support structure 200.

The support element 120 may comprise a bonding face 122 by which the support element 120 is bonded to the first axially outer surface 112. The bonding face 122 may be configured to have a reduced stiffness towards its periphery and a higher stiffness towards a central area of the bonding face.

Thus the support element is configured to reduce a stress concentration which may arise at the periphery of the bonding face in response to a force acting on the electromagnet.

A plurality of support elements 120 may be bonded to the first axially outer surface. The plurality of support elements 120 may be equally spaced around the first axially outer surface 112.

According to other examples, the plurality of support elements may be irregularly spaced. That is to say, the plurality of support elements 120 may be unequally distributed around the first axially outer surface 112.

The coil 110 may comprise a second axially outer surface 114 opposite to the first axially outer surface 112. A further support element 120' may be bonded to the second axially outer surface 114.

The electromagnet 100 and the support element 120 may be bonded using an adhesive suitable for cryogenic applications.

The coil 110 and the support element 120 may be resin-impregnated to form a monolithic structure.

According to another example there may be provided an electromagnet assembly 10 for a MRI apparatus, comprising: the electromagnet 100 according to the present disclosure, and a support structure 200 comprising a support plate 210, 220, wherein the support element 120 is mounted to the support plate 210, 220.

The support structure 200 may comprise a pair of spaced-apart support plates 210, 220 forming a cavity 215 therebetween. The support element 120 may be received into the cavity 215 and mechanically fastened to the support plates 210, 220.

An extension tube 310 may be fitted around a pin 300 for making a pinned connection between the support plate 210, 220 and the support element 120. The extension tube 310 may be configured to abut against the support plate 210, 220 and the pin 300 to maintain compression on the support element 120 when the coil 110 is in its superconducting state.

Thus the extension tube is configured to maintain compression in a case where the support element has a greater coefficient of thermal contraction than the pin.

The support plates 210, 220 may be configured to press the support element 120 and the further support element 120' against the coil 110 when the coil is in its superconducting state.

Thus the support element 120 and the further support element 120' are configured to secure the coil. In use, the support element and the further support may cooperate with the support plate to press against the first axially outer surface of the coil and the second axially outer surface of the coil.

The support element 120 and the support plate 210, 220 may be configured to make a pinned connection for securing the electromagnet 100 to the support structure 200.

According to another example there may be provided an MRI apparatus comprising the electromagnet assembly 10 as described above.

According to another example there may be provided a method of manufacturing an electromagnet for an MRI apparatus. The method may comprise winding a superconductor wire into a mould to form a coil 110, arranging a support element 120 against a first external surface 112 of the coil 110, impregnating the coil 110 and the support element 120 with a thermosetting resin, and removing the coil 110 and the support element 120 from the mould.

The method of manufacturing may comprise placing a further support element 120' against a second external surface 114 of the coil 110, the second external surface 114 being opposite to the first external surface 112 of the coil 110.

BRIEF DESCRIPTION OF THE DRAWINGS

Examples of the present disclosure will now be described with reference to the accompanying drawings, in which.

DETAILED DESCRIPTION

The present application is concerned with an electromagnet suitable for being mounted in an electromagnet assembly which restrains the electromagnet axially and circumferentially, thereby preventing distortion of the electromagnet arrangement along or around its assembly axis A-A (described below).

Figure 1:
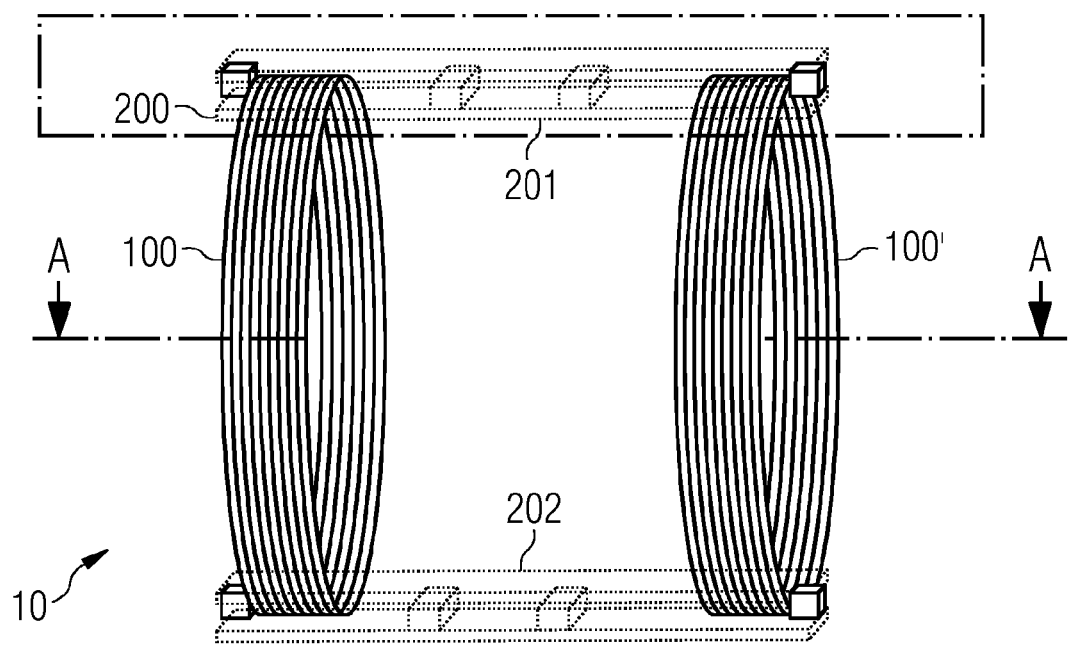
FIG. 1 is a schematic perspective view of an electromagnet assembly.

FIG. 1 shows a schematic illustration of a perspective view of an electromagnet assembly 10 according to the present disclosure.

In use, the electromagnet assembly 10 forms part of a Magnetic Resonance Imaging (MRI) apparatus (or 'scanner'). For such a purpose the electromagnet assembly may be contained within a housing which, in operation, contains an inert gas as a coolant, for example helium. Hence the housing forms a cryogen vessel, which enables the electromagnet assembly to be cooled to sufficiently low temperatures to optimise performance.

The electromagnet assembly 10 is generally rotationally/ circumferentially symmetrical, defining an assembly axis A-A, a radial direction and a circumferential direction. Accordingly, "axial" refers to a direction parallel to the assembly axis, while "radial" refers to a direction perpendicular to the assembly axis, and "circumferential" refers to a direction perpendicular to both the assembly axis and the radial direction around the assembly axis A-A. The electromagnet assembly extends axially (or "lengthwise") along the assembly axis.

The electromagnet assembly 10 comprises a pair of electromagnets 100 and a support structure 200 configured to carry the electromagnets.

The support structure 200 is arranged to retain the electromagnets 100 in a particular spatial (i.e. relatively spaced) arrangement, preventing each electromagnet from moving along the assembly axis A-A or rotating about the assembly axis. For this purpose, the electromagnets are mechanically fastened to the support structure. According to the present example, the electromagnets 100 are mounted to two brackets 201, 202 of the support structure. In alternative examples a different number of brackets may be provided. For example, greater than three brackets may be provided. The number of brackets used may be (at least in part) dependent on the expected loads and the allowable deflection of the electromagnets.

Figure 2:
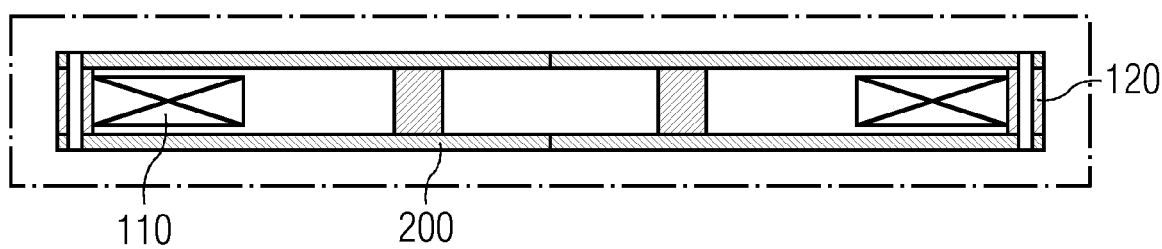
FIG. 2 shows a radial cross-section of the electromagnet assembly of FIG. 1.

FIG. 2 shows a cross-sectional view of the electromagnet assembly 10 wherein the electromagnets 100 are mounted to the support structure 200.

According to the present example, the electromagnets 100 are configured to generate a magnetic field which, in use, actively shields the magnetic field which is generated by a main magnet of the MRI apparatus. Each electromagnet 100 comprises a coil 110 (or 'shield coil') configured to generate the magnet field.

Further, each electromagnet comprises a support element 120, which is mountable in the MRI apparatus. The support element is configured to restrain the coil against forces caused, for example, in response to electromagnetic interaction between coils. For the present example it is assumed that electromagnetic interaction causes a force on each coil which is directed outwardly with respect to the electromagnet assembly 10. That is, each coil experiences a force pressing the coil against its respective support element. Further, the support element also restrains the coil against rotational forces as may be caused, for example, during transportation.

The coil 110 is formed of a superconductor wire wound into an annular structure. The coil is therefore essentially rotationally symmetrical. The coil may be described in terms of an axial direction, a radial direction and a circumferential direction. When considered in the context of the MRI apparatus, these directions correspond to those described above in relation to the MRI apparatus as a whole. In particular, the coil possesses rotational symmetry about the assembly axis A-A.

Figure 3:
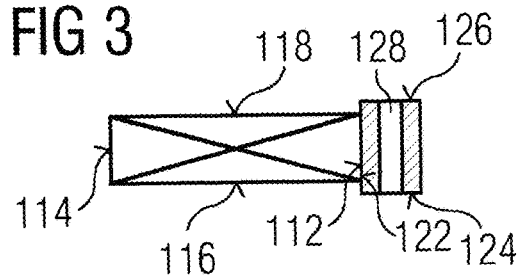
FIG. 3 shows a radial cross-section of an electromagnet according to FIGS. 1 and 2.
Figure 4:
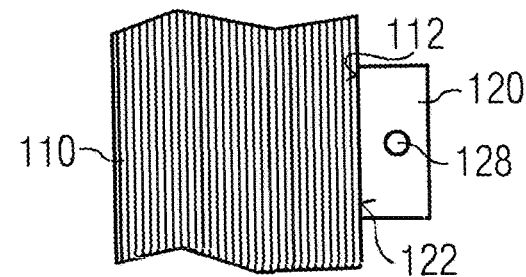
FIG. 4 shows a tangential cross-section of the electromagnet of FIG. 3.

FIGS. 3 and 4 show the coil 110 and the support element 120.

The coil 110 has a first axial end face 112 and, opposite thereto, a second axial end face 114. The pair of axial end faces delimits an extent of the coil along the axial direction. Similarly, the coil has a first radial surface 116 (or 'inner radial surface') and, opposite thereto, a second radial surface 118 (or 'outer radial surface'). The pair of radial surfaces delimits an extent of the coil along the radial direction.

The support element 120 is fixed to the coil 110 and provides a means for mounting the coil in the MRI and, more specifically, to the support structure 200. The support element has a bonding face 122 which is bonded to the coil. The support element, or at least the bonding face, is configured to be bonded using an adhesive suitable for cryogenic applications. According to the present example, the support element is bonded to the first axial end face 112 of the coil.

The support element 120 possesses a pair of mating surfaces 124, 126 configured for being brought into abutment/contact with the support structure 200. According to the present example, the mating surfaces 124, 126 are substantially flat so as to sit flat against a corresponding portion of the support structure 200.

According to the present example, in which the support element 120 is bonded to the first axial end face 122, the mating surfaces a separated by a distance which is greater than the radial extent (or 'radial thickness') of the coil 110. Thereby the curvature of the coil may be accommodated between the mating surfaces. Radial expansion of the coil, in response to energising, is also accommodated by suitably spacing the mating surfaces.

The support element 120 is configured for mounting the coil to the support structure 200. Accordingly, the support element 120 comprises means for mechanically securing to the support structure 200. Any suitable means may be used such as, for examples, bolts, pins or other suitable mechanical elements. In the present example the support element comprises an aperture 128 for receiving a pin and thus make a pinned connection with the support structure. By way of example, a pin 300 is shown in FIG. 13. However, for clarity, the pins (or other mechanical elements) are not shown in FIGS. 2 to 12.

Figure 5:
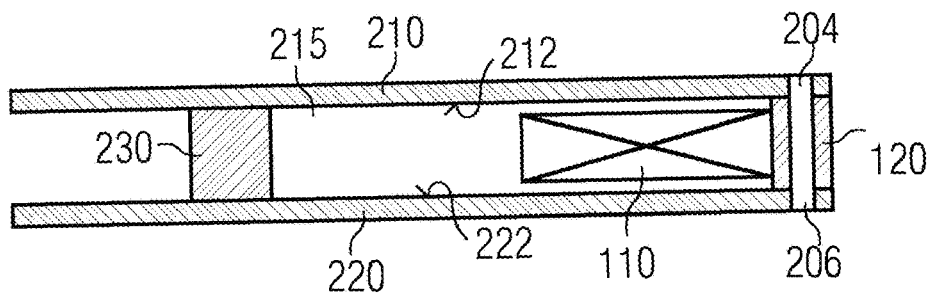
FIG. 5 is a radial cross-section of the electromagnet assembly.
Figure 6:
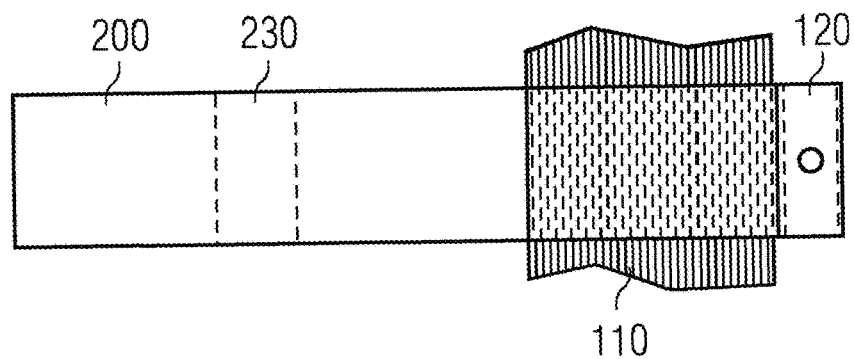
FIG. 6 shows a tangential cross-section of the electromagnet of FIG. 5.

FIGS. 5 and 6 show the electromagnet 100 mounted in the support structure 200. More particularly, FIG. 5 shows a radial cross-section of the support structure, the coil 110 and the support element 120, while FIG. 6 shows a corresponding tangential cross-section.

The support structure 200 comprises a pair of support plates 210, 220 configured to receive the electromagnet 100. More particularly, an upper support plate 210 and a lower support plate 220 are arranged to define a passage (or 'cavity') 215 into which the support element 120 of the electromagnet is received. According to the present example, the support plates are arranged generally parallel but may alternatively be arranged non-parallel to provide for a different stiffness of the support structure. The passage so formed is suitably shaped to receive the support element 120 and, according to the present example, defined by substantially flat sections 212, 222 of the support plates 210, 220 which match the substantially flat mating surfaces 116, 118 of the support element. As explained with reference to FIG. 1, the example electromagnet assembly 10 comprises two brackets 201, 202. Each bracket comprises a pair of support plates 210, 220.

According to the present example, where a pair of electromagnets 100 is carried by the support plates 200, each support plate extends from a first electromagnet 100 to a second electromagnet 100'.

When received between the support plates 210, 220, the support element 120 is anchored to at least one but preferably both support plates. Suitably an aperture 204, 206 is provided in each in each support plate 210, 220. For securing the support element, the aperture 128 of the support element 120 is aligned with the apertures 204, 206 of the support structure. A pin is then fitted through the aligned apertures 204, 206, 128, thus bringing the electromagnet assembly 10 from an unlocked configuration into a locked/fixed configuration. In the locked configuration, relative movement between the support element and the support structure are restrained (or 'inhibited').

A bracing element 230 may be provided which extends between the support plates 210, 220. The size and/or location of the bracing element is chosen to modify the stiffness of the support elements, where necessary, in order to accommodate for expected loads acting on the electromagnet assembly 10. Such loads may be caused by ferrous building material present where the electromagnet assembly will be operated (for example metal reinforcement rods or girders in floors and walls). Other loads may be caused internally, particularly in response to interaction between the magnets. More particularly, an inwardly-acting coaxial force may be caused on each electromagnet 10. That is, the electromagnet assembly 10 may also be configured to operate in compression if the electromagnetic load direction is reversed. Sufficient bracing between the plates will be required to prevent buckling, and the bracing element may be sized and/or located suitably.

For applications relating to Magnetic Resonance Imaging, it is considered convenient to assemble an MRI apparatus completely, or as much as feasible, before transportation to its destination. This may save days or weeks of assembly time. Also, without requiring initial assembly and final assembly, this may reduce the amount of coolant required, thus saving precious resources resulting in a 'greener' final product. During transportation of a fully or partially assembled apparatus, however, rotational loads may act on the coils 110. If unchecked, the forces can misalign or deform the coils and, consequently, adversely affect performance of the assembly.

However the provision of the bonded support elements 120 provides axial restraint and rotational (or 'circumferential') restraint of the electromagnet 100 relative to the support structure 200.

Additionally, during operation the electromagnetic interaction between the coils 110 is restrained by the interaction of the support elements 120 and support structure 200, thus preventing relative axial and radial movement of the coils, thereby optimising performance of the device.

Hence the bonded support elements 120 of the present disclosure provide support for the coils 110 against rotational loads to inhibit distortion of the assembly during transit and in operation, thus increasing the chance of optimised performance of the final product.

The exemplary electromagnet 100 according to the present disclosure may be manufactured using any suitable process of manufacturing.

An example process by which the electromagnet 100 may be manufactured relates to the known process of resin-impregnation. As part of this process, superconductor wire is wound into a mould. The support element is arranged with the coil so formed, locating the support element against an external surface of the coil. Where a plurality of support elements is located on the external surface, they may be arranged with equal spacing.

The resulting structure is then impregnated with a thermosetting resin and the resin allowed or caused to set. Subsequently the electromagnet is removed from the mould as a monolithic structure.

According to the example process described, the step of forming the coil by winding superconductor wire is essentially unaffected by the later addition of the support element. That is, the coil is formed into a shape optimised for performance, essentially without consideration for bonding to or being carried by the support element.

The bonding between the coil 110 and the support element 120 may also be achieved using resin-impregnation, either at the same time as forming the coil, or once the coil is formed. Resin-impregnation is known to provide great structural strength to a coil, but according to the present disclosure said structural strength is used also for bonding the coil and the support element. Notably, the bond may be reinforced, for example through the addition glass fibre to the resin, to provide a bond sufficiently strong for the intended application. In particular, the bond may be made strong enough to withstand a tensile force which may be caused in response to a reversal of the electromagnetic interaction between the electromagnets 100.

Alternatively the support element 120 is secured to a resin-impregnated coil 110 in a separate manufacturing step.

This may be achieved using an adhesive suitable for, where desired, cryogenic applications.

The prepared electromagnet 100 is mounted to the support structure 200 to form the electromagnet assembly 10. This process includes locating the support element 120 of the electromagnet 100 in the passage 215 formed between the support plates 210, 220, aligning the aperture 128 of the support element with the apertures 204, 206 of the support plates, and fitting a pin through the aligned apertures. It is noted that shape-matching of pins, particularly round pins, in corresponding apertures is efficiently achievable to high accuracy. This provides for a predictable load distribution to ensure optimal performance of the electromagnets.

Particularly for applications relating to cryogenic applications, which includes Magnetic Resonance Imaging, the electromagnets 100 are cooled below a critical temperature at which the coils 110 enter a superconducting state. For efficient cooling it is beneficial to expose a large surface area of the coils to the coolant. Conveniently, the electromagnet 10 according to the present disclosure allows for relatively small support elements so that a relatively large surface area remains exposed.

Figure 7:
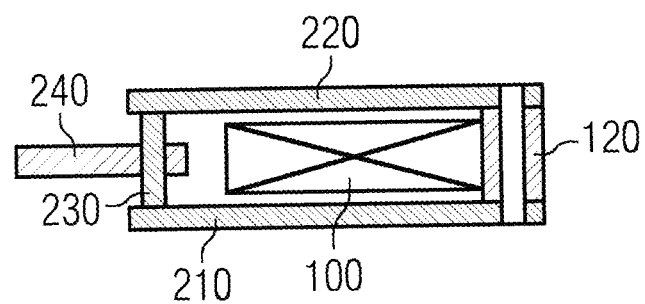
FIG. 7 shows a radial cross-section of a first variant of the electromagnet assembly.
Figure 8:
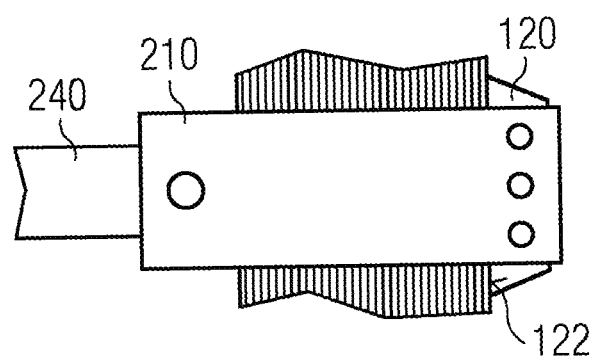
FIG. 8 shows a tangential cross-section of the electromagnet assembly of FIG. 7.
Figure 9:
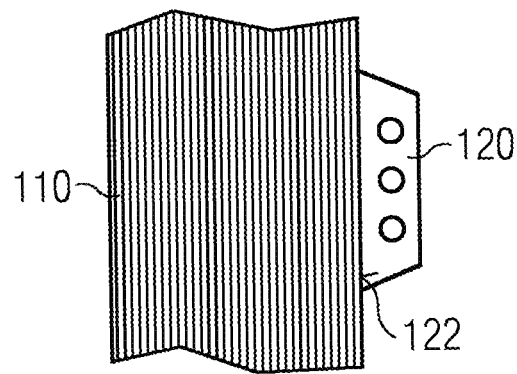
FIG. 9 is a radial cross-section of an electromagnet according to FIGS. 7 and 8.

FIGS. 7, 8 and 9 show an alternative arrangement of the electromagnet assembly 10 which is configured to support particularly against compressive loads.

FIG. 7 is a radial cross-sectional view of the electromagnet assembly 10, while FIG. 8 is a plan view of the electromagnet assembly, and FIG. 9 shows a tangential cross-section of the electromagnet 100. Similar to FIGS. 5 and 6, FIGS. 7 and 8 are partial views in the sense that only a right-hand side of the electromagnet assembly 10 is depicted. That is to say, the essentially identical left-hand side is omitted from the figure.

According to the example shown in FIGS. 7 and 8, the support plates 210, 220 extend partway between the pair of electromagnets 100. This is in contrast to the example of FIG. 5 in which the support plates extend all of the way from the first electromagnet to the second electromagnet. Put another way, in the example of FIGS. 7, 8 each electromagnet 100 is provided with its own pair of support plates 210, 220. A bracing element 230 is provided between each pair of support plates 210, 220. A rod 240, which may also be provided in the above example, extends between the bracing elements 230.

The example of FIGS. 7, 8 and 9 also illustrates an alternative shape of the support element 120. According to this example, the bonding face 122 possesses reduced stiffness towards the periphery delimiting the bonding face. That is to say, the support element 120 is formed to be more flexible on its bonding face 122 towards a periphery of the bonding face than towards a central area of the bonding face, the central area being delimited by the periphery. This arrangement is suitable for minimising "edge effects". "Edge effects" may arise in response to stresses exerted on the coil 110, irrespective of whether compressive or tensile loads are concerned. As regards a compressive load where the coil 110 is pressed against the bonding face 122, the edge effects may result in a stress concentration at the periphery (or 'edge') of the bonding face which may cause damage to the coil or the support element. As regards a tensile load where the coil is pulled along an axial direction away from the bonding face, a stress concentration at the periphery of the bonding face may cause damage to the bond between the coil and the bonding face. Reducing edge effects will thus also reduce the likelihood of failure of the bond between the support element 120 and coil 100.

Figure 10:
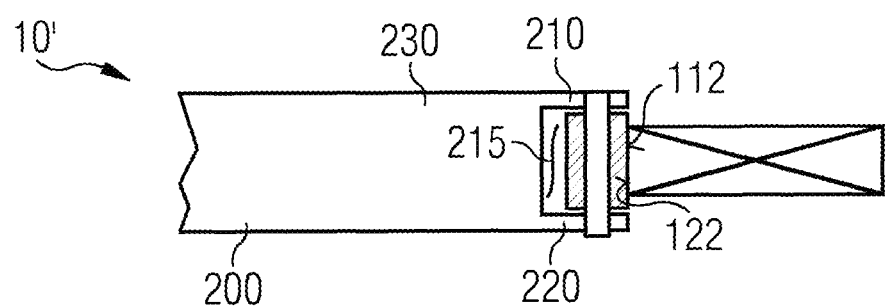
FIG. 10 is a radial cross-section of a second variant of the electromagnet assembly.

FIG. 10 shows a radial cross-sectional view of a part of an alternative example of an electromagnet assembly 10' according to the present disclosure. According to the example depicted in FIG. 10, the electromagnet assembly is configured to operate in compression. That is, in use the electromagnetic load direction acts to bring the coils 100 together along the assembly axis A-A. To improve resistance to buckling, the support plates 210, 220 and the bracing element 230 are formed integrally. The support plates 210, 220 and the bracing element 230 may comprise solid or hollow sections. For example the support plates 210, 220 and the bracing element 230 may be solid or hollow section extrusions. Additionally, the passage/cavity 215 defined between the support plates 210, 220 correspond to a local cut-out sized to accommodate the support element 120 only. This arrangement therefore provides for a relatively large bracing element and a relatively small passage 215, providing a particularly high resistance to buckling under compression. With suitable configuration and/or choice of materials, for example those of the coil surface 112 and the bonding face 122, this example electromagnet assembly may also be operable in tension, where the integral bracing element 230 supports the induced loads.

Figure 11:
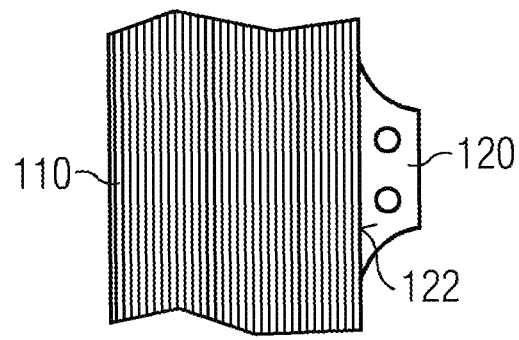
FIG. 11 shows a tangential cross-section of another electromagnet.

FIG. 11 illustrates an alternative shape for the support element 120. According to this example, the support element has a generally trapezoid cross-sectional shape. The legs (or sides) of the trapezoid shape are convex to further reduce stiffness towards the periphery.

Figure 12:
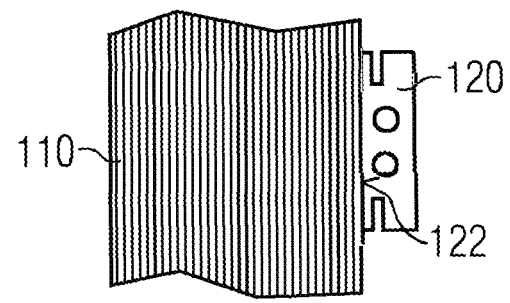
FIG. 12 shows a tangential cross-section of yet a further electromagnet.
Figure 13:
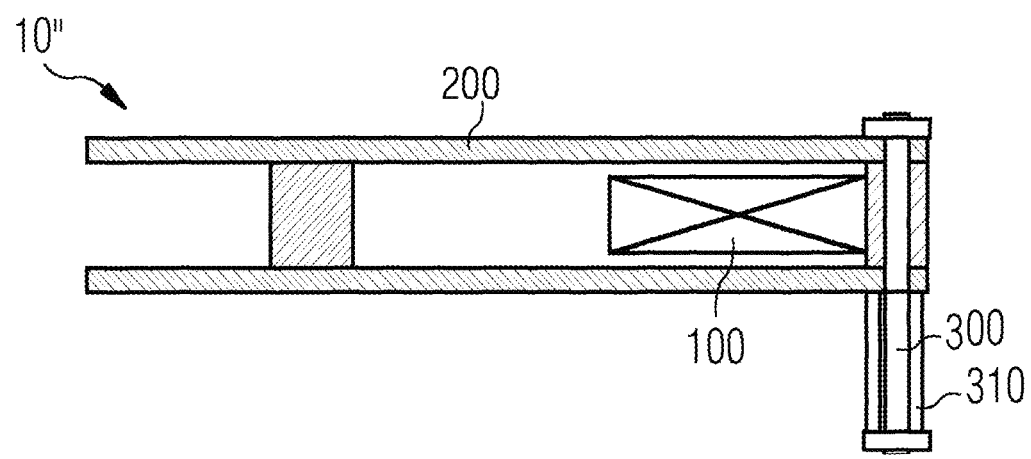
FIG. 13 shows a third variant of the electromagnet assembly.

FIG. 12 shows another alternative shape for the support element 120 configured to reduce edge effects. According to this example, the support element comprises cutaway sections towards the periphery of the bonding face 122, which provides the periphery of the bonding face with greater flexibility.

FIG. 13 shows another alternative example of an electromagnet assembly 10" according to the present disclosure. According to this example, the electromagnet 100 is mounted in the support structure 200 such that a compressive load exerted by the pinned connection is maintained after cooling the system below the critical temperature of the superconductor coil 110. Where the support element 120 has a higher coefficient of thermal contraction than the pin 300 or pins used to make the pinned connection, as the system is cooled compression cannot be maintained so that the electromagnet is not fully secured. According to the present example, an extension tube 310 is fitted around the pin, wherein the extension tube (or 'sleeve') has a lower coefficient of thermal contraction than the pin. The extension tube is configured to abut against the support plates 210, 220 and the pin 300 to compress the support plates against the support element even when cooled, and thus maintain compression.

Figure 14:
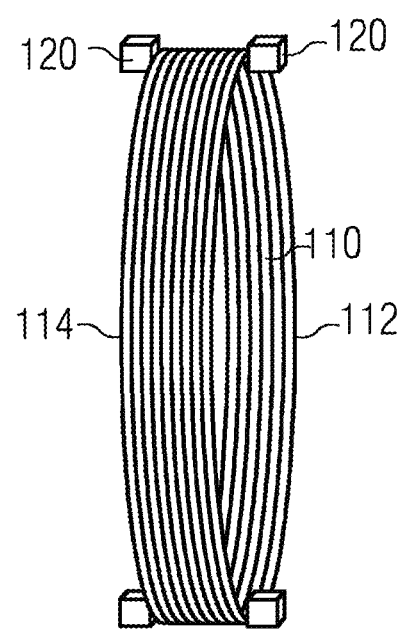
FIG. 14 shows a perspective view of further example of an electromagnet according to the present disclosure.

FIG. 14 shows a perspective view of a variant of the electromagnet 100. In the examples described above, at least one support element 120 is bonded to the first axial end face 112. In other examples, at least one support element 120 may be bonded to each axial end face 112, 114 or, more generally, to each pair of opposing external surfaces of the coil. That is, a first support element is bonded to a first outer surface of the coil, a second support element is bonded to a corresponding location of a second outer surface which is opposite to the first outer surface. According to FIG. 14, the first support element 120 is bonded to the first axial end face 112, while the second support element 120' is bonded to the second axial end face 114.

It is considered convenient to provide a support structure configured to compress the coil along the assembly axis A-A when the support structure and the coil are cooled and/or the coil is energised. For this purpose, the support structure may be configured to possess greater thermal contraction than the coil along the axial direction. Additionally or alternatively, the support structure and the coil are configured so that an expansion of the coil on being energised results in the support structure pressing the support elements against the coil. Conveniently, the described arrangement may reduce misalignment of the coil on being energised and may improve durability of the bonding.

In relation to the examples where the support elements 120 are bonded to the axial end faces, the first support element is located at a particular circumferential location on the first axial end face, and a second support element is located in on essentially the same circumferential location on the second axial end face.

Where a support element 120 is bonded to a radial surface, the bonding face 122 of said support element is suitably curved, convex or concave, dependent on the particular radial surface to which it is mounted. Further, the support structure is suitably adapted for mounting an electromagnet 100 having a support element or elements 120 on a radial surface or surfaces 116, 118.

Attention is directed to all papers and documents which are filed concurrently with or previous to this specification in connection with this application and which are open to public inspection with this specification, and the contents of all such papers and documents are incorporated herein by reference.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing embodiment(s). The invention extends to any novel one, or any novel combination, of the features disclosed in this specification (including any accompanying claims, abstract and drawings), or to any novel one, or any novel combination, of the steps of any method or process so disclosed.

The invention claimed is:

1. An electromagnet of an electromagnet assembly for a Magnetic Resonance Imaging (MRI) apparatus, the electromagnet comprising:
    an annular coil that is configured to generate a magnetic field and has a first axially outer surface;
    a support element that is bonded to the first axially outer surface of the annular coil, and is configured to mount the annular coil in the MRI apparatus; and
    a support structure comprising a pair of axially-directed support plates spaced apart from one another along a radial direction of the annular coil by a distance which is greater than a radial thickness of the annular coil forming a cavity therebetween, wherein the support element is received in the cavity and mechanically fastened to the support plates.

2. The electromagnet according to claim 1, wherein the support element is configured to be mechanically fastened to the support structure.

3. The electromagnet according to claim 1, wherein the support element comprises a bonding face by which the support element is bonded to the first axially outer surface of the annular coil, and the bonding face is configured to have a reduced stiffness towards its periphery and a higher stiffness towards its central area.

4. The electromagnet according to claim 1, wherein a plurality of support elements is bonded to and equally spaced around the first axially outer surface of the annular coil.

5. The electromagnet according to claim 1, wherein the annular coil comprises a second axially outer surface opposite the first axially outer surface, and a further support element is bonded to the second axially outer surface.

6. The electromagnet according to claim 1, wherein the electromagnet and the support element are bonded using an adhesive suitable for cryogenic applications.

7. The electromagnet according to claim 1, wherein the annular coil and the support element are resin-impregnated to form a monolithic structure.

8. An electromagnet assembly for a Magnetic Resonance Imaging (MRI) apparatus, the electromagnet assembly comprising:
    an electromagnet, comprising:
        an annular coil that is configured to generate a magnetic field and has a first axially outer surface;
        a support element that is bonded to the first axially outer surface of the annular coil, and is configured to mount the annular coil in the MRI apparatus; and
        a support structure comprising a pair of axially-directed support plates spaced apart from one another along a radial direction of the annular coil by a distance which is greater than a radial thickness of the annular coil forming a cavity therebetween, wherein the support element is received in the cavity and mechanically fastened to the support plates; and
    an extension tube fitted around a pin to be configured to make a pinned connection between the support plates and the support element,
    wherein the extension tube is configured to abut against the support plates, and the pin is configured to maintain compression on the support element when the annular coil is in its superconducting state.

9. The electromagnet assembly according to claim 8, wherein the annular coil comprises a second axially outer surface opposite the first axially outer surface, and a further support element is bonded to the second axially outer surface, and
    wherein the support plates are configured to press the support element and the further support element against the annular coil when the annular coil is in its superconducting state.

10. The electromagnet assembly according to claim 8, wherein the support element and the support plate are configured to make a pinned connection to secure the electromagnet to the support structure.

11. An MRI apparatus comprising the electromagnet assembly according to claim 1.

* * * * *